United States Patent
Yun et al.

(10) Patent No.: US 10,381,413 B2
(45) Date of Patent: Aug. 13, 2019

(54) ORGANIC PHOTOELECTRIC DEVICE AND IMAGE SENSOR AND ELECTRONIC DEVICE

(71) Applicant: Samsung Electronics Co., Ltd., Suwon-si, Gyeonggi-do (KR)

(72) Inventors: Sung Young Yun, Suwon-si (KR); Gae Hwang Lee, Seongnam-si (KR); Kwang Hee Lee, Hwaseong-si (KR); Dong-Seok Leem, Hwaseong-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/914,725

(22) Filed: Mar. 7, 2018

(65) Prior Publication Data

US 2019/0074327 A1    Mar. 7, 2019

(30) Foreign Application Priority Data

Sep. 5, 2017 (KR) .......................... 10-2017-0113384

(51) Int. Cl.
*H01L 27/30* (2006.01)
*H01L 51/44* (2006.01)
*H01L 31/14* (2006.01)

(52) U.S. Cl.
CPC ............ *H01L 27/307* (2013.01); *H01L 31/14* (2013.01); *H01L 51/44* (2013.01); *H01L 51/441* (2013.01)

(58) Field of Classification Search
CPC ...... H01L 27/307; H01L 51/441; H01L 51/44
See application file for complete search history.

(56) References Cited

U.S. PATENT DOCUMENTS 9,425,240 B2   8/2016 Liang et al.
9,548,463 B2   1/2017 Yagi et al.
(Continued)

FOREIGN PATENT DOCUMENTS

EP    2978023 A2    1/2016
JP    05-121771     5/1993
(Continued)

OTHER PUBLICATIONS

Jin, Z. "PIN Architecture for ultrasensitive organic thin film photoconductors" Sci Rep 4, 5331 published Jun. 17, 2014 pp. 1-7.*
(Continued)

*Primary Examiner* — Grant S Withers
(74) *Attorney, Agent, or Firm* — Harness, Dickey & Pierce, P.L.C.

(57) ABSTRACT

Disclosed are an organic photoelectric device including a first electrode and a second electrode facing each other and a photoelectric conversion layer disposed between the first electrode and the second electrode and selectively absorbing light in a green wavelength region, wherein the photoelectric conversion layer includes at least one first photoelectric conversion material having a peak absorption wavelength ($\lambda_{max1}$) of less than about 540 nm and a at least one second photoelectric conversion material having a peak absorption wavelength ($\lambda_{max2}$) of greater than or equal to about 540 nm, and an image sensor, and an electronic device.

16 Claims, 10 Drawing Sheets

(56) References Cited

U.S. PATENT DOCUMENTS

| | | |
|---|---|---|
| 9,673,259 B2 | 6/2017 | Park et al. |
| 9,818,956 B2 | 11/2017 | Ro et al. |
| 9,876,184 B2 | 1/2018 | Liang et al. |
| 2012/0097229 A1 | 4/2012 | Aoki |
| 2016/0020258 A1* | 1/2016 | Park .................. H01L 51/447 257/40 |
| 2016/0181547 A1 | 6/2016 | Han et al. |
| 2016/0211465 A1 | 7/2016 | Tadao et al. |
| 2016/0301013 A1 | 10/2016 | Rie et al. |
| 2016/0358978 A1 | 12/2016 | Liang et al. |
| 2017/0148994 A1 | 5/2017 | Choi et al. |
| 2017/0250227 A1 | 8/2017 | Park et al. |
| 2018/0273760 A1* | 9/2018 | Rosselli .............. C09B 23/0066 |

FOREIGN PATENT DOCUMENTS

| | | |
|---|---|---|
| KR | 1009394 | 1/2011 |
| KR | 2015-0026714 A | 3/2015 |
| KR | 2015-0026808 A | 3/2015 |
| KR | 20160009404 A | 1/2016 |
| KR | 2016-0052448 A | 5/2016 |
| KR | 2016-0075335 A | 6/2016 |
| KR | 2016-0089809 A | 7/2016 |
| KR | 2016-0122012 A | 10/2016 |
| KR | 20170060488 A | 6/2017 |

OTHER PUBLICATIONS

Bulliard, X. "Dipolar donor-acceptor molecules in the cyanine limit for high efficiency green-light-selective organic photodiodes" J. Mater. Chem. C, 4 published Jan. 4, 2016 pp. 1117-1125.*

Lim, S-J. "Organic-on-silicon complementary metal-oxide-semiconductor colour image sensors" Sci. Rep. 5, article No. 7708 Jan. 12, 2015 pp. 1-7.*

Nagata, A. "Effects of Au nanoparticle addition to hole transfer layer in organic solar cells based on copper naphthalocyanine and fullerene" Prog. In Nat. Sci.: Mat. Int. vol. 24, Iss. 3 Jun. 2014 pp. 179-183.*

Yang (Michael) Yang et al. High-performance multiple-donor bulk heterojunction solar cells, Nature Photonics, Feb. 9, 2015, pp. 190-193, vol. 9.

European Search Report dated Nov. 30, 2018 for corresponding European Patent Application No. 18168063.8.

* cited by examiner

ORGANIC PHOTOELECTRIC DEVICE AND IMAGE SENSOR AND ELECTRONIC DEVICE

CROSS-REFERENCE TO RELATED APPLICATION

This application claims priority to and the benefit of Korean Patent Application No. 10-2017-0113384 filed in the Korean Intellectual Property Office on Sep. 5, 2017, the entire contents of which are incorporated herein by reference.

BACKGROUND

1. Field

An organic photoelectric device, an image sensor, and an electronic device are disclosed.

2. Description of the Related Art

A photoelectric device converts light into an electrical signal using photoelectric effects, it may include a photodiode, a phototransistor, and the like, and it may be applied to an image sensor, a solar cell, an organic light emitting diode, and the like.

An image sensor including a photodiode requires high resolution and thus a small pixel. At present, a silicon photodiode is widely used, but it has a problem of deteriorated sensitivity since it has a small absorption area due to small pixels. Accordingly, an organic material that is capable of replacing silicon has been researched.

An organic material has a high extinction coefficient and selectively absorbs light in a particular wavelength region depending on a molecular structure, and thus may simultaneously replace a photodiode and a color filter and resultantly improve sensitivity and/or contribute to higher integration.

However, since the organic material exhibits different characteristics from those of silicon due to high binding energy and/or a recombination behavior, the characteristics of the organic material are difficult to precisely predict, and thus required properties of a photoelectric device may not be easily controlled.

SUMMARY

An example embodiment provides an organic photoelectric device capable of easily controlling required properties.

Another example embodiment provides an image sensor including the organic photoelectric device.

Yet another example embodiment provides an electronic device including the image sensor.

According to an example embodiment, an organic photoelectric device includes a first electrode and a second electrode facing each other and a photoelectric conversion layer disposed between the first electrode and the second electrode and selectively absorbing light in a green wavelength region, wherein the photoelectric conversion layer includes at least one first photoelectric conversion material having a peak absorption wavelength ($\lambda_{max1}$) of less than about 540 nm and a at least one second photoelectric conversion material having a peak absorption wavelength ($\lambda_{max2}$) of greater than or equal to about 540 nm.

An absorption spectrum of the first photoelectric conversion material and an absorption spectrum of the second photoelectric conversion material may overlap at at least one part.

The first photoelectric conversion material may have a peak absorption wavelength ($\lambda_{max1}$) of greater than or equal to about 510 nm and less than about 540 nm and the second photoelectric conversion material may have a peak absorption wavelength ($\lambda_{max2}$) of about 540 nm to about 560 nm.

An average of the peak absorption wavelength ($\lambda_{max1}$) of the first photoelectric conversion material and the peak absorption wavelength ($\lambda_{max2}$) of the second photoelectric conversion material may belong to a range of about 530 nm to about 550 nm.

An average of the peak absorption wavelength ($\lambda_{max1}$) of the first photoelectric conversion material and the peak absorption wavelength ($\lambda_{max2}$) of the second photoelectric conversion material may belong to a range of about 535 nm to about 545 nm.

Each of the first photoelectric conversion material and the second photoelectric conversion material may have a light absorption full width at half maximum (FWHM) of less than or equal to about 100 nm.

Each of the first photoelectric conversion material and the second photoelectric conversion material may have a HOMO energy level of about 5.30 eV to about 5.80 eV.

Each of an extinction coefficient at a peak absorption wavelength ($\lambda_{max1}$) of the first photoelectric conversion material and a peak absorption wavelength ($\lambda_{max2}$) of the second photoelectric conversion material may be greater than or equal to about $6.5 \times 10^4$ cm$^{-1}$.

Each of an extinction coefficient at a peak absorption wavelength ($\lambda_{max1}$) of the first photoelectric conversion material and a peak absorption wavelength ($\lambda_{max2}$) of the second photoelectric conversion material may be about $6.5 \times 10^4$ cm$^{-1}$ to about $1.5 \times 10^5$ cm$^{-1}$.

The photoelectric conversion layer may include at least one p-type semiconductor and at least one n-type semiconductor to form a pn junction and each of the first photoelectric conversion material and the second photoelectric conversion material may be the p-type semiconductor.

The n-type semiconductor may include fullerene or a fullerene derivative.

The first photoelectric conversion material and the second photoelectric conversion material may independently include a light absorption material represented by Chemical Formula 1.

$$EDG\text{—}HA\text{—}EAG \qquad \text{[Chemical Formula 1]}$$

In Chemical Formula 1,

HA is a C2 to C30 heterocyclic group having at least one of Se, Te, S, and Si,

EDG is an electron donating group, and

EAG is an electron accepting group.

A peak absorption wavelength ($\lambda_{max}$) of the photoelectric conversion layer may belong to a range of about 530 nm to about 560 nm.

A peak absorption wavelength ($\lambda_{max}$) of the photoelectric conversion layer may belong to a range of about 533 nm to about 550 nm.

A light absorption full width at half maximum (FWHM) of the photoelectric conversion layer may be less than or equal to about 140 nm.

According to another example embodiment, an image sensor includes the organic photoelectric device.

The image sensor may further include a semiconductor substrate disposed under the organic photoelectric device and the semiconductor substrate may include a first photo-sensing device configured to sense light in a red wavelength region and a second photo-sensing device configured to sense light in a blue wavelength region.

The image sensor may further include the organic photoelectric device and may include a first organic photoelectric device configured to sense light in a green wavelength region, a second organic photoelectric device configured to sense light in a red wavelength region, and a third organic photoelectric device configured to sense light in a blue wavelength region.

According to another example embodiment, an electronic device includes the organic photoelectric device.

According to yet another example embodiment, an electronic device including the image sensor is provided.

Properties required in an organic photoelectric device and an image sensor may be more easily controlled.

DETAILED DESCRIPTION

Figure 1:
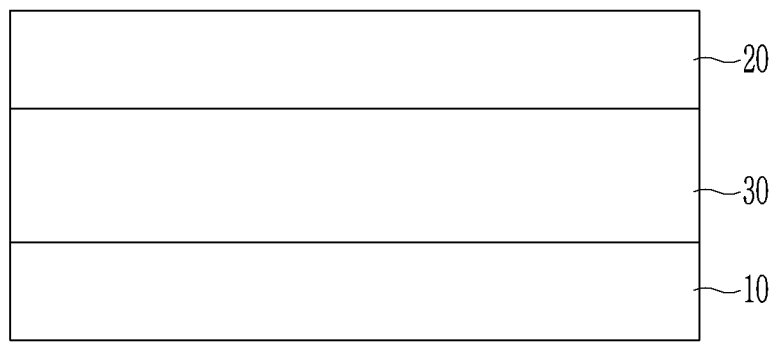
FIG. 1 is a cross-sectional view showing an organic photoelectric device according to an example embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the example embodiments, and the same or similar constituent elements are indicated by the same reference numeral throughout the specification.

Hereinafter, 'combination' refers to a mixture of two or more and a stack structure of two or more.

As used herein, when a definition is not otherwise provided, 'substituted' refers to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

Hereinafter, a HOMO energy level is expressed as an absolute value from a vacuum level. In addition, when the HOMO energy level is said to be 'deep' or 'high,' the HOMO energy level has a large absolute value based on '0 eV' of the vacuum level, while when the HOMO energy level is 'shallow' or 'low,' the HOMO energy level has a small absolute value based on '0 eV' of the vacuum level.

Hereinafter, an organic photoelectric device according to an example embodiment is described.

FIG. 1 is a cross-sectional view showing an organic photoelectric device according to an example embodiment.

Referring to FIG. 1, an organic photoelectric device 100 according to an example embodiment includes a first electrode 10 and a second electrode 20 facing each other and a photoelectric conversion layer 30 between the first electrode 10 and the second electrode 20.

A substrate (not shown) may be disposed on a surface of the first electrode 10 or a surface of the second electrode 20. The substrate may be for example made of an inorganic material such as glass, an organic material such as polycarbonate, polymethylmethacrylate, polyethyleneterephthalate, polyethylenenaphthalate, polyamide, polyethersulfone, or a combination thereof, or a silicon wafer.

One of the first electrode 10 and the second electrode 20 may be an anode and the other may be a cathode. For example, the first electrode 10 may be an anode and the second electrode 20 may be a cathode.

At least one of the first electrode 10 and the second electrode 20 may be a light-transmitting electrode and the light-transmitting electrode may be for example made of a conductive oxide such as an indium tin oxide (ITO), indium zinc oxide (IZO), zinc oxide (ZnO), tin oxide (SnO), aluminum tin oxide (AlTO), and fluorine doped tin oxide (FTO), or a metal thin layer of a single layer or a multilayer. When one of the first electrode 10 and the second electrode 20 is a non-light-transmitting electrode, it may be made of for example an opaque conductor such as aluminum (Al), silver (Ag), or gold (Au). For example, the first electrode 10 and the second electrode 20 may be all light-transmitting electrodes. For example, the second electrode 20 may be a light receiving electrode disposed at a light receiving side.

The photoelectric conversion layer 30 may selectively absorb light of at least a part of a wavelength region out of a visible ray wavelength region, for example, light of a green wavelength region (hereinafter, referred to as 'green light'), light of a blue wavelength region (hereinafter, referred to as 'blue light'), and light of a red wavelength region (hereinafter, referred to as 'red light').

For example, the photoelectric conversion layer 30 may selectively absorb at least one from the green light, the blue light, and the red light. Herein, the selective absorption of at least one from the green light, the blue light, and the red light means that an absorption spectrum thereof has a peak absorption wavelength in one range among the ranges of about 500 about to 600 nm, greater than or equal to about 380 nm and less than about 500 nm, and greater than about 600 nm and less than or equal to about 700 nm and is higher in a corresponding wavelength region than in the other wavelength regions.

For example, the photoelectric conversion layer 30 may selectively absorb green light.

The photoelectric conversion layer 30 is a layer including at least one p-type semiconductor and at least one n-type semiconductor to provide a pn junction, which is a layer producing excitons by receiving light from outside and then separating holes and electrons from the produced excitons.

The photoelectric conversion layer 30 may include at least two p-type semiconductors having a different peak absorption wavelength ($\lambda_{max}$) and a different absorption spectrum.

For example, the photoelectric conversion layer 30 may include at least one first photoelectric conversion material having a peak absorption wavelength ($\lambda_{max1}$) and at least one second photoelectric conversion material having a peak absorption wavelength ($\lambda_{max2}$). An absorption spectrum of the first photoelectric conversion material and an absorption spectrum of the second photoelectric conversion material may be different but may overlap at at least one part.

Figure 2:
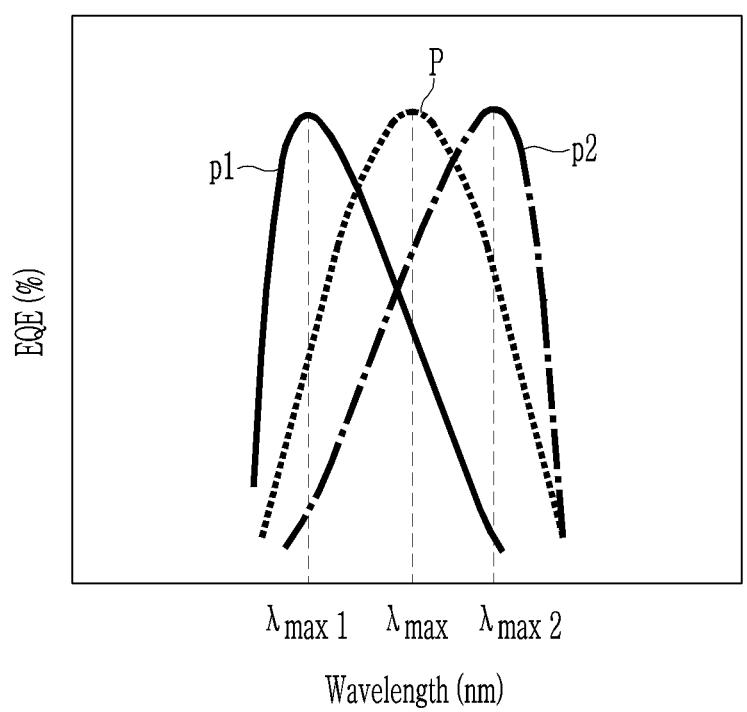
FIG. 2 is a schematic view showing an absorption spectrum of an organic photoelectric device according to an example embodiment.

FIG. 2 is a schematic view showing an absorption spectrum of an organic photoelectric device according to an example embodiment.

Referring to FIG. 2, the photoelectric conversion layer includes a first photoelectric conversion material having a first absorption spectrum (p1) and a first peak absorption wavelength ($\lambda_{max1}$) and a second photoelectric conversion material having a second absorption spectrum (p2) and a second peak absorption wavelength ($\lambda_{max2}$) and has an absorption spectrum (P) respectively overlapped with the first absorption spectrum (p1) and the second absorption spectrum (p2) and a peak absorption wavelength ($\lambda_{max}$) between the first peak absorption wavelength ($\lambda_{max1}$) and the second peak absorption wavelength A ($\lambda_{max2}$).

For example, the photoelectric conversion layer 30 may include at least one first photoelectric conversion material having a peak absorption wavelength ($\lambda_{max1}$) in a green wavelength region and at least one second photoelectric conversion material having a peak absorption wavelength ($\lambda_{max2}$) in a green wavelength region. An absorption spectrum of the first photoelectric conversion material and an absorption spectrum of the second photoelectric conversion material may be different but may overlap at at least one part.

For example, the photoelectric conversion layer 30 may include at least one first photoelectric conversion material having a peak absorption wavelength ($\lambda_{max1}$) of less than about 540 nm and a at least one second photoelectric conversion material having a peak absorption wavelength ($\lambda_{max2}$) of greater than or equal to about 540 nm. An absorption spectrum of the first photoelectric conversion material and an absorption spectrum of the second photoelectric conversion material may be different but may overlap at at least one part.

For example, the first photoelectric conversion material may have a peak absorption wavelength ($\lambda_{max1}$) in a range of greater than or equal to about 510 nm and less than about 540 nm, and the second photoelectric conversion material may have a peak absorption wavelength ($\lambda_{max2}$) in a range of about 540 nm to about 560 nm. Within the ranges, the first photoelectric conversion material may have a peak absorption wavelength ($\lambda_{max1}$) for example in a range of about 515 nm to about 539 nm, and the second photoelectric conversion material may have a peak absorption wavelength ($\lambda_{max2}$) in a range of about 540 nm to about 559 nm. Within the ranges, the first photoelectric conversion material may have a peak absorption wavelength ($\lambda_{max1}$) for example in a range of about 518 nm to about 537 nm, and the second photoelectric conversion material may have a peak absorption wavelength ($\lambda_{max2}$) in a range of about 540 nm to about 557 nm.

For example, the peak absorption wavelength ($\lambda_{max1}$) of the first photoelectric conversion material and the peak absorption wavelength ($\lambda_{max2}$) of the second photoelectric conversion material may have an average in a range of about 530 nm to about 550 nm. Within the range, the peak absorption wavelength ($\lambda_{max1}$) of the first photoelectric conversion material and the peak absorption wavelength ($\lambda_{max2}$) of the second photoelectric conversion material may have an average for example in a range of about 535 nm to about 545 nm, for example, about 537 nm to about 543 nm, for example, about 538 nm to about 542 nm, for example, about 539 nm to about 541 nm, and, for example, about 540 nm.

For example, the peak absorption wavelength ($\lambda_{max1}$) of the first photoelectric conversion material and the peak absorption wavelength ($\lambda_{max2}$) of the second photoelectric conversion material may have a difference ranging from about 5 nm to about 40 nm, and within the range, for example, about 10 nm to about 37 nm, and for example, about 15 nm to about 35 nm.

The first photoelectric conversion material and the second photoelectric conversion material may have a small full width at half maximum (FWHM), for example, a full width at half maximum (FWHM) of less than or equal to about 100 nm based on the peak absorption wavelength ($\lambda_{max1}$) and the peak absorption wavelength ($\lambda_{max2}$). Herein, the full width at half maximum (FWHM) is a width of a wavelength corresponding to a half of a peak absorption point and may be defined with a reference to an absorbance measured with a UV-Vis spectroscope meter, unless specific definition is otherwise provided. When a photoelectric conversion material has a small full width at half maximum (FWHM), the photoelectric conversion material may selectively absorb light in a narrow wavelength region and thus have high wavelength selectivity.

Within the range, the first and second photoelectric conversion materials may for example have a full width at half maximum (FWHM) of less than or equal to about 98 nm, for example, less than or equal to about 97 nm, for example, less than or equal to about 95 nm, for example, less than or equal to about 93 nm, for example, less than or equal to about 92 nm, and for example, less than or equal to about 90 nm.

Within the range, the first and second photoelectric conversion materials may have, for example, a full width at half maximum (FWHM) respectively ranging from about 50 nm to about 100 nm, within the range, for example, from about 50 nm to about 98 nm, for example, from about 50 nm to about 97 nm, for example, from about 50 nm to about 95 nm, for example, from about 50 nm to about 93 nm, for example, from about 50 nm to about 92 nm, and for example, from about 50 nm to about 90 nm.

The first and second photoelectric conversion materials may have a high extinction coefficient, for example, an extinction coefficient of greater than or equal to about $6.5 \times 10^4$ cm$^{-1}$, at a peak absorption wavelength ($\lambda_{max1}$) and a peak absorption wavelength ($\lambda_{max2}$). Since the first and second photoelectric conversion materials have an extinction coefficient within the range, optical characteristics may be improved by increasing an absorbance at the peak absorption wavelength ($\lambda_{max1}$) and the peak absorption wavelength ($\lambda_{max2}$). Within the range, the first and second photoelectric conversion materials may have for example an extinction coefficient of greater than or equal to about $6.6 \times 10^4$ cm$^{-1}$. The first and second photoelectric conversion materials may have an extinction coefficient of about $6.5 \times 10^4$ cm$^{-1}$ to about $1.5 \times 10^5$ cm$^{-1}$ respectively at a peak absorption wavelength ($\lambda_{max1}$) and a peak absorption wavelength ($\lambda_{max2}$), within the range, for example, about $6.6 \times 10^4$ cm$^{-1}$ to about $1.5 \times 10^5$ cm$^{-1}$, within the range, for example, about $6.6 \times 10^4$ cm$^{-1}$ to about $1.2 \times 10^5$ cm$^{-1}$, and within the range, for example, about $6.6 \times 10^4$ cm$^{-1}$ to about $1.0 \times 10^5$ cm$^{-1}$.

The first and second photoelectric conversion materials may have, for example, a HOMO energy level of about 5.30 eV to about 5.80 eV, respectively. Within the range, the first and second photoelectric conversion materials may respectively have, for example, a HOMO energy level in a range of about 5.35 eV to about 5.76 eV, and within the range, a HOMO energy level in a range of about 5.39 eV to about 5.76 eV. The first and second photoelectric conversion materials have a HOMO energy level within the range and thus satisfactory electric characteristics.

The first and second photoelectric conversion materials may have an energy bandgap ranging from about 1.7 to about 2.3 eV, respectively. Within the range, the first and second photoelectric conversion materials may have, for example, an energy bandgap ranging from about 1.8 to about 2.2 eV, respectively, and within the range, for example, from about 1.9 to about 2.1 eV, respectively. The first and second photoelectric conversion materials respectively have an energy bandgap within the range and thus may have high external quantum efficiency (EQE) at the peak absorption wavelength ($\lambda_{max1}$) and the peak absorption wavelength ($\lambda_{max2}$) and thus improve photoelectric conversion efficiency.

The first and second photoelectric conversion materials have no particular limit, as far as the aforementioned optical and electric characteristics are satisfied, but may be for example selected from organic compounds simultaneously having an electron donating moiety and an electron accepting moiety.

For example, the first and second photoelectric conversion materials may be independently an organic compound having a structure that the electron donating group and the electron accepting group as a substituent are bonded with a pi-conjugation core having semiconductor characteristics.

For example, the first photoelectric conversion material and the second photoelectric conversion material may independently be for example a light absorbing material represented by Chemical Formula 1, but is not limited thereto.

EDG—HA—EAG     [Chemical Formula 1]

In Chemical Formula 1,

HA is a C2 to C30 heterocyclic group having at least one of Se, Te, S, and Si, EDG is an electron donating group, and EAG is an electron accepting group.

As described above, the photoelectric conversion layer 30 includes at least two p-type semiconductors having a different absorption spectrum and a different peak absorption wavelength ($\lambda_{max}$), and thus properties required of the photoelectric conversion layer 30 may be easily controlled. For example, optical characteristics of the photoelectric conversion layer 30 such as a desired peak absorption wavelength ($\lambda_{max}$) and full width at half maximum (FWHM) may be satisfied without deteriorating electrical properties thereof. Accordingly, when a single organic compound is used, desired properties of the photoelectric conversion layer 30 may be realized by overcoming a limit that characteristics of the organic compound are difficult to control.

For example, the photoelectric conversion layer 30 may have peak absorption wavelength ($\lambda_{max}$) in a range of about 530 nm to about 560 nm, within the range, for example in a range of about 533 nm to about 550 nm, and within the range, for example, in a range of about 535 nm to about 545 nm. In addition, the photoelectric conversion layer 30 may have a full width at half maximum (FWHM) of less than or equal to about 140 nm based on the peak absorption wavelength ($\lambda_{max}$), within the range, a full width at half maximum (FWHM) ranging from about 50 nm to about 140 nm, within the range, for example, a full width at half maximum (FWHM) ranging from about 70 nm to about 130 nm, within the range, a full width at half maximum (FWHM) ranging from about 70 nm to about 120 nm, and within the range, a full width at half maximum (FWHM) ranging from about 80 nm to about 115 nm.

The n-type semiconductor may be any counter material of the above p-type semiconductor without a particular limit, for example, a light absorbing material, for example, a light absorbing material absorbing at least a part out of light in a visible ray region, and for example, fullerene or a fullerene derivative but is not limited thereto.

The photoelectric conversion layer 30 may be an intrinsic layer (an I layer) wherein the above p-type semiconductor and the n-type semiconductor are mixed as a bulk heterojunction. Herein, the p-type semiconductor and the n-type semiconductor may be mixed in a volume ratio of about 1:9 to about 9:1, within the range, for example, in a volume ratio of about 2:8 to about 8:2, about 3:7 to about 7:3, about 4:6 to about 6:4, or about 5:5.

When the p-type semiconductor includes the above first and second photoelectric conversion materials, the first and second photoelectric conversion materials may be mixed in a volume ratio of about 1:9 to 9:1, within the range, for example, in a volume ratio of about 2:8 to about 8:2, about 3:7 to about 7:3, about 4:6 to about 6:4, or about 5:5.

The photoelectric conversion layer 30 may further include a p-type layer and/or an n-type layer that are disposed on a lower and/or upper surface of the intrinsic layer (I layer).

The photoelectric conversion layer 30 may be for example a bilayer, for example, one photoelectric conversion layer including a first photoelectric conversion material (a p-type semiconductor) and a n-type semiconductor and the other photoelectric conversion layer including a second photoelectric conversion material (a p-type semiconductor) and an n-type semiconductor.

The organic photoelectric device 100 may further include an anti-reflection layer (not shown) on one surface of the first electrode 10 or the second electrode 20. The anti-reflection layer is disposed at a light incidence side and lowers reflectance of light of incident light and thereby light absorbance is further improved. For example, when light enters from the first electrode 10, the anti-reflection layer may be disposed on the first electrode 10 while when light enters from the second electrode 20, the anti-reflection layer may be disposed under the second electrode 20.

The anti-reflection layer may include, for example a material having a refractive index of about 1.6 to about 2.5, and may include for example at least one of a metal oxide, a metal sulfide, and an organic material having a refractive index within the ranges. The anti-reflection layer may include, for example a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide such as zinc sulfide; or an organic material such as an amine derivative, but is not limited thereto.

In the organic photoelectric device 100, when light enters from the first electrode 10 or the second electrode 20 and the photoelectric conversion layer 30 absorbs light in a predetermined or alternatively, desired wavelength region, excitons may be produced from the inside. The excitons are separated into holes and electrons in the photoelectric conversion layer 30, and the separated holes are transported to an anode that is one of the first electrode 10 and the second electrode 20 and the separated electrons are transported to the cathode that is the other of the first electrode 10 and the second electrode 20 so as to flow a current.

While example embodiments discussed above disclose two peak absorption wavelengths in the green band, the present disclosure is not so limited and two peak absorption wavelengths may be chosen from among the red or blue band and/or different bands altogether.

While example embodiments discussed above disclose two peak absorption wavelengths, the present disclosure is not so limited and more than two peak absorption wavelengths may be chosen from among the green, red and/or blue bands.

Hereinafter, an organic photoelectric device according to another example embodiment is described.

Figure 3:
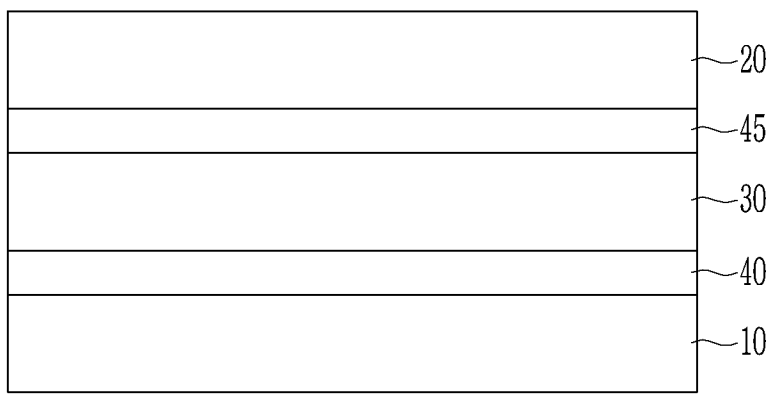
FIG. 3 is a cross-sectional view showing an organic photoelectric device according to another example embodiment.

FIG. 3 is a cross-sectional view showing an organic photoelectric device according to another example embodiment.

Referring to FIG. 3, the organic photoelectric device 200 according to the present example embodiment includes a first electrode 10 and a second electrode 20 and a photoelectric conversion layer 30 disposed between the first electrode 10 and the second electrode 20 like the above example embodiment. The first electrode 10, the second electrode 20, and the photoelectric conversion layer 30 are the same as described above.

However, the organic photoelectric device 200 according to the present example embodiment further includes each charge auxiliary layer 40 and 45 between the first electrode 10 and the photoelectric conversion layer 30 and the second electrode 20 and the photoelectric conversion layer 30. The charge auxiliary layer may make holes and electrons separated in the photoelectric conversion layer 30 be transported easily to improve efficiency.

The charge auxiliary layers 40 and 45 may include at least one selected from a hole injection layer for facilitating hole injection, a hole transport layer for facilitating hole transport, an electron blocking layer for preventing electron transport, an electron injection layer for facilitating electron injection, an electron transport layer for facilitating electron transport, and a hole blocking layer for preventing hole transport.

The charge auxiliary layer 40 and 45 may include for example an organic material, an inorganic material, or an organic/inorganic material. The organic material may be an organic material having hole or electron characteristics and the inorganic material may be for example a metal oxide such as a molybdenum oxide, a tungsten oxide, or a nickel oxide.

The hole transport layer (HTL) and/or the hole injection layer (HIL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron blocking layer (EBL) and/or the electron injection layer (EIL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris (N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Either one of the charge auxiliary layers 40 and 45 may be omitted.

The organic photoelectric device may be applied to an image sensor, a photodetector, a photosensor, and an organic light emitting diode (OLED), and the like, but is not limited thereto.

The organic photoelectric device may be for example applied to an image sensor.

Hereinafter, an example of an image sensor including the organic photoelectric device is described referring to drawings. As an example of an image sensor, an organic CMOS image sensor is described.

Figure 4:
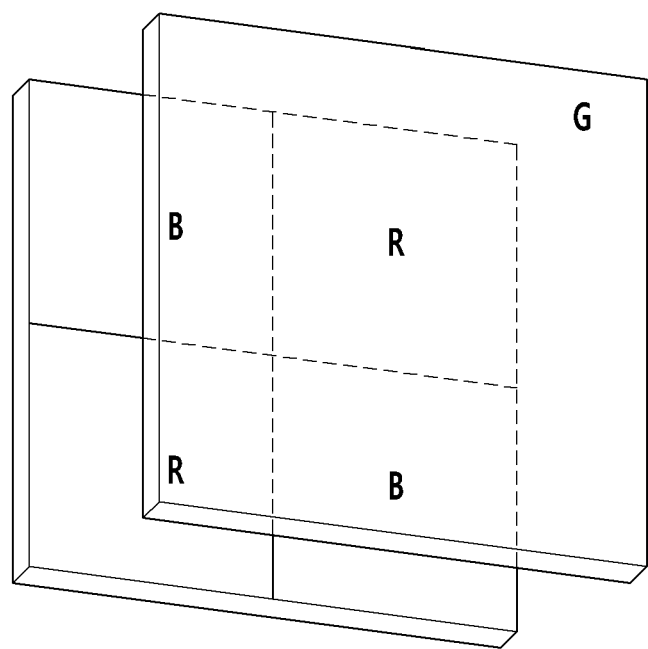
FIG. 4 is a schematic top plan view showing an organic CMOS image sensor according to an example embodiment.
Figure 5:
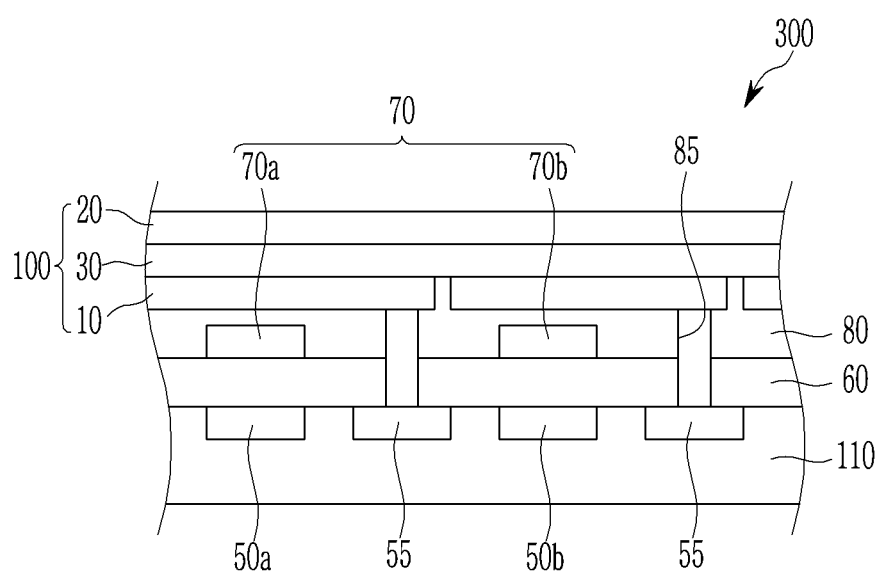
FIG. 5 is a cross-sectional view showing one example of the organic CMOS image sensor of FIG. 4.

FIG. 4 is a schematic top plan view of an organic CMOS image sensor according to an example embodiment and FIG. 5 is a cross-sectional view showing one example of the organic CMOS image sensor of FIG. 4.

Referring to FIGS. 4 and 5, an organic CMOS image sensor 300 according to an example embodiment includes a semiconductor substrate 110 integrated with photo-sensing devices 50a and 50b, a transmission transistor (not shown) and a charge storage 55, a lower insulation layer 60, a color filter layer 70, an upper insulation layer 80, and/or an organic photoelectric device 100.

The semiconductor substrate 110 may be a silicon substrate, and is integrated with the photo-sensing devices 50a and 50b, the transmission transistor (not shown), and the charge storage 55. The photo-sensing devices 50a and 50b may be photodiodes.

The photo-sensing devices 50a and 50b, the transmission transistor, and/or the charge storage 55 may be integrated in each pixel, and as shown in the drawing, the photo-sensing devices 50a and 50b may be included in a blue pixel and a red pixel, respectively, and the charge storage 55 may be included in a green pixel.

The photo-sensing devices 50a and 50b sense light, the information sensed by the photo-sensing devices may be transferred by the transmission transistor, the charge storage 55 is electrically connected to the organic photoelectric device 100 that will be described later, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the photo-sensing device 50a and 50b.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench exposing the charge storage 55. The trench may be filled with fillers.

A color filter layer 70 is formed on the lower insulation layer 60. The color filter layer 70 includes a blue filter 70a formed in a blue pixel and a red filter 70b in a red pixel. In the present example embodiment, a green filter is not included, but a green filter may be further included.

The upper insulation layer 80 is formed on the color filter layer 70. The upper insulation layer 80 eliminates a step caused by the color filter layer 70 and smoothes the surface. The upper insulation layer 80 and the lower insulation layer 60 may include a contact hole (not shown) exposing a pad, and a through-hole 85 exposing the charge storage 55 of the green pixel.

The organic photoelectric device 100 is formed on the upper insulation layer 80. The organic photoelectric device 100 includes the first electrode 10, the photoelectric conversion layer 30, and the second electrode 20 as described above. In the drawing, the first electrode 10, the photoelectric conversion layer 30, and the second electrode 20 are sequentially stacked, but this disclosure is not limited thereto, and for example they may be stacked in an order of the second electrode 20, the photoelectric conversion layer 30, and the first electrode 10.

The first electrode 10 and the second electrode 20 may be all light-transmitting electrodes and the photoelectric conversion layer 30 is the same as described above. The photoelectric conversion layer 30 may for example selectively absorb light in a green wavelength region and may replace a color filter of a green pixel.

Light in a green wavelength region of light that enters from the second electrode 20 is mainly absorbed by the photoelectric conversion layer 30 and photoelectrically converted and light in a remaining wavelength region is transmitted through the first electrode 10 and is sensed by the photo-sensing devices 50a and 50b.

Focusing lens (not shown) may be further formed on the organic photoelectric device 100. The focusing lens may control a direction of incident light and gather the light in one region. The focusing lens may have a shape of, for example, a cylinder or a hemisphere, but is not limited thereto.

As described above, the organic photoelectric device 100 has a stack structure thereby a size of an image sensor may be reduced to realize a smaller image sensor.

In addition, as described above, properties required of the image sensor may be easily controlled by including an organic photoelectric device 100 including the photoelectric conversion layer 30. For example, the organic photoelectric device 100 has satisfactory wavelength selectivity and optical properties about a particular wavelength, for example, a green wavelength region, and thus sensitivity (YSNR10) of the image sensor having a layered structure may be effectively improved.

Herein, the said YSNR10 is a numerical value showing sensitivity of the image sensor and measured in a method described in "Image Sensors and Image Quality in Mobile Phones" by Juha Alakarhu in International Image Sensor Workshop (2007, Ogunquit Me., USA) but indicates a minimum illumination expressed by lux, wherein a signal and a noise becomes a ratio of 10. Accordingly, as the YSNR10 is smaller, the sensitivity may be higher.

In order to manufacture an image sensor having high sensitivity, the YSNR10 may be less than or equal to about 120 lux, within the range, for example, less than or equal to about 115 lux, within the range, for example, less than or equal to about 112 lux, within the range, for example, less than or equal to about 110 lux, within the range, for example, less than or equal to 108 lux, within the range, for example, less than or equal to about 105 lux, within the range, for example, less than or equal to about 103 lux, and within the range, for example, less than or equal to about 100 lux.

For example, the aforementioned image sensor may have smaller YSNR10 than those of an image sensor including an organic photoelectric device including the above first photoelectric conversion material alone as a p-type semiconductor and an image sensor including an organic photoelectric device including the above second photoelectric conversion material alone as a p-type semiconductor. Accordingly, the first material and second photoelectric conversion materials as a p-type semiconductor may be used to control required properties and thus realize an image sensor having small YSNR10 and resultantly, improve sensitivity of the image sensor.

FIG. 5 shows an example structure where the organic photoelectric device of FIG. 1 is stacked, but the organic photoelectric device of FIG. 2 may be equally applied thereto.

Figure 6:
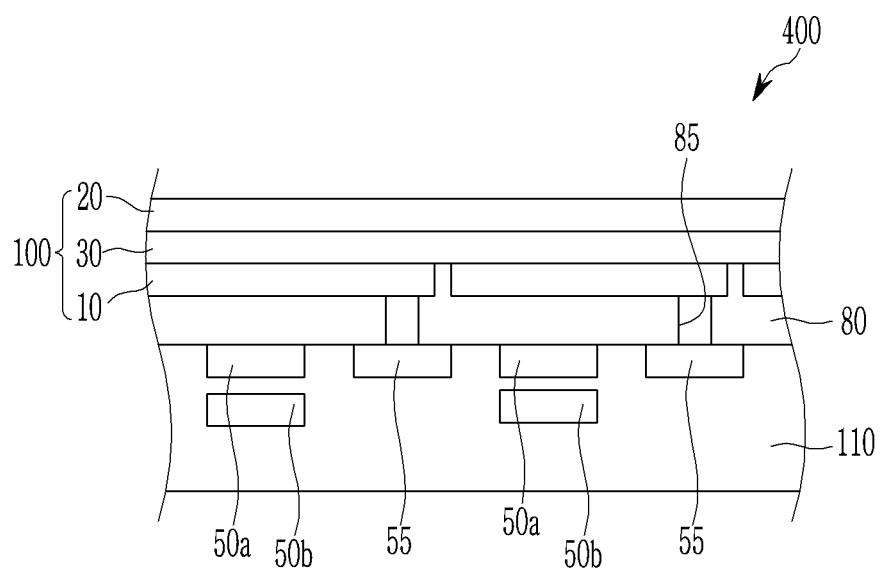
FIG. 6 is a cross-sectional view showing another example of the organic CMOS image sensor.

FIG. 6 is a cross-sectional view showing another example of the organic CMOS image sensor.

The organic CMOS image sensor 400 according to the present example embodiment like the above example embodiment includes a semiconductor substrate 110 integrated with photo-sensing devices 50a and 50b, a transmission transistor (not shown), and a charge storage 55, an upper insulation layer 80 having a through-hole 85, and an organic photoelectric device 100.

However, in the CMOS image sensor 400 according to the present example embodiment unlike the above example embodiment, the photo-sensing devices 50a and 50b are stacked in a vertical direction, but the color filter layer 70 is omitted. The photo-sensing devices 50a and 50b are electrically connected to charge storage (not shown) and may be transferred by the transmission transistor. The photo-sensing devices 50a and 50b may selectively absorb light in each wavelength region depending on a stacking depth.

Focusing lens (not shown) may be further formed on the organic photoelectric device 100. The focusing lens may control a direction of incident light and gather the light in one region. The focusing lens may have a shape of, for example, a cylinder or a hemisphere, but is not limited thereto.

As described above, the organic photoelectric device configured to selectively absorb light in a green wavelength region has a stack structure and the red photo-sensing device and the blue photo-sensing device are stacked and thus the size of an image sensor may be reduced to realize a smaller image sensor.

FIG. 6 exemplarily shows a structure that the organic photoelectric device of FIG. 1 is stacked, but the organic photoelectric device of FIG. 2 may be applied thereto.

Figure 7:
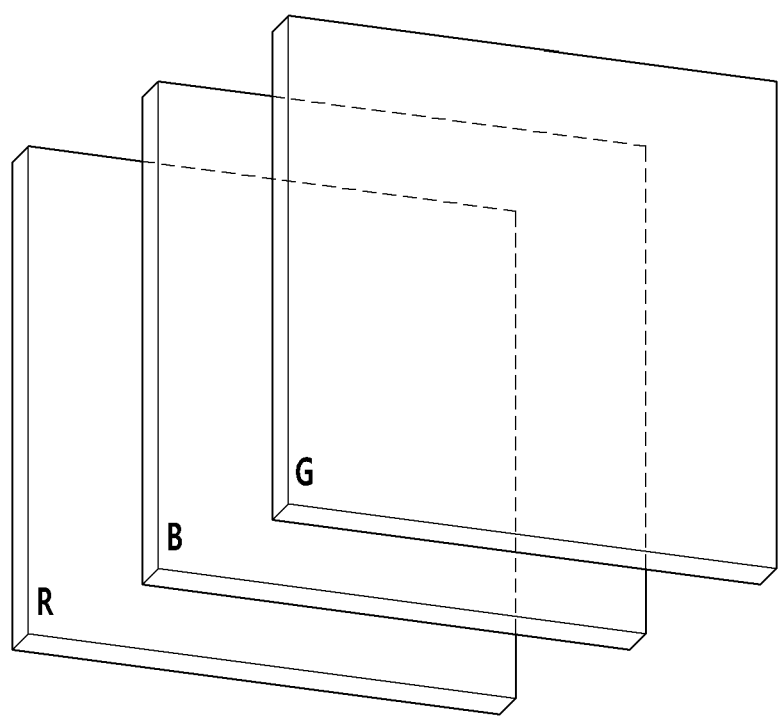
FIG. 7 is a schematic top plan view showing an organic CMOS image sensor according to another example embodiment.
Figure 8:
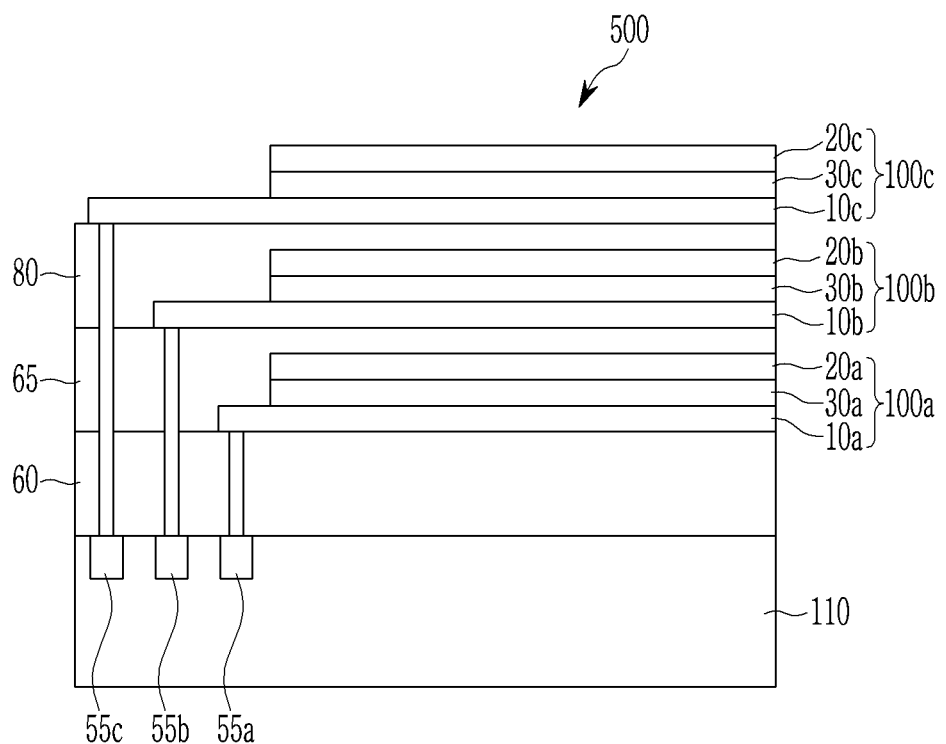
FIG. 8 is a cross-sectional view showing the organic CMOS image sensor of FIG. 6.

FIG. 7 is a schematic top plan view of an organic CMOS image sensor according to another example embodiment and FIG. 8 is a cross-sectional view of the organic CMOS image sensor of FIG. 6.

The organic CMOS image sensor 500 according to the present example embodiment includes a green photoelectric device configured to selectively absorb light in a green wavelength region, a blue photoelectric device configured to selectively absorb light in a blue wavelength region, and a red photoelectric device configured to selectively absorb light in a green wavelength region, and they are stacked.

The organic CMOS image sensor 500 according to the present example embodiment includes a semiconductor substrate 110, a lower insulation layer 60, an intermediate insulation layer 65, an upper insulation layer 80, a first organic photoelectric device 100*a*, a second organic photoelectric device 100*b*, and a third organic photoelectric device 100*c*.

The semiconductor substrate 110 may be a silicon substrate, and is integrated with the transmission transistor (not shown) and the charge storages 55*a*, 55*b*, and 55*c*.

A metal wire (not shown) and a pad (not shown) are formed on the semiconductor substrate 110, and the lower insulation layer 60 is formed on the metal wire and the pad.

The first organic photoelectric device 100*a* is formed on the lower insulation layer 60.

The first organic photoelectric device 100*a* includes a first electrode 10*a* and a second electrode 20*a* facing each other and a photoelectric conversion layer 30*a* between the first electrode 10*a* and the second electrode 20*a*. The first electrode 10*a*, the second electrode 20*a*, and the photoelectric conversion layer 30 are the same as described above and the photoelectric conversion layer 30*a* may selectively absorb light in one of red, blue, and green wavelength regions. For example, the first organic photoelectric device 100*a* may be a red photoelectric device.

In the drawing, the first electrode 10*a*, the photoelectric conversion layer 30*a*, and the second electrode 20*a* are sequentially stacked, but this disclosure is not limited thereto, and for example they may be stacked in an order of the second electrode 20*a*, the photoelectric conversion layer 30*a*, and the first electrode 10*a*.

An intermediate insulation layer 65 is formed on the first organic photoelectric device 100*a*.

The second organic photoelectric device 100*b* is formed on the intermediate insulation layer 65.

The second organic photoelectric device 100*b* includes a first electrode 10*b* and a second electrode 20*b* facing each other and a photoelectric conversion layer 30*b* between the first electrode 10*b* and the second electrode 20*b*. The first electrode 10*b*, the second electrode 20*b*, and the photoelectric conversion layer 30*b* may be described above and the photoelectric conversion layer 30*b* may selectively absorb light in one of red, blue, and green wavelength regions. For example, the second organic photoelectric device 100*b* may be a blue photoelectric device.

In the drawing, the first electrode 10*b*, the photoelectric conversion layer 30*b*, and the second electrode 20*b* are sequentially stacked, but this disclosure is not limited thereto, and for example they may be stacked in an order of the second electrode 20*b*, the photoelectric conversion layer 30*b*, and the first electrode 10*b*.

The upper insulation layer 80 is formed on the second organic photoelectric device 100*b*. The lower insulation layer 60, the intermediate insulation layer 65, and the upper insulation layer 80 have a plurality of through-holes exposing the charge storages 55*a*, 55*b*, and 55*c*.

The third organic photoelectric device 100*c* is formed on the upper insulation layer 80. The third organic photoelectric device 100*c* includes a first electrode 10*c* and a second electrode 20*c* facing each other and a photoelectric conversion layer 30*c* between the first electrode 10*c* and the second electrode 20*c*. The first electrode 10*c*, the second electrode 20*c*, and the photoelectric conversion layer 30*c* are the same as described above and the first and second photoelectric conversion layers 30*c* may selectively absorb light in one of red, blue, and green wavelength regions. For example, the third organic photoelectric device 100*c* may be a green photoelectric device and the organic photoelectric device 100 may be applied.

In the drawing, the first electrode 10*c*, the photoelectric conversion layer 30*c*, and the second electrode 20*c* are sequentially stacked, but this disclosure is not limited thereto, and for example they may be stacked in an order of the second electrode 20*c*, the photoelectric conversion layer 30*c*, and the first electrode 10*c*.

Focusing lens (not shown) may be further formed on the organic photoelectric device 100*c*. The focusing lens may control a direction of incident light and gather the light in one region. The focusing lens may have a shape of, for example, a cylinder or a hemisphere, but is not limited thereto.

In the drawing, as the first organic photoelectric device 100*a*, the second organic photoelectric device 100*b*, and the third organic photoelectric device 100*c*, the organic photoelectric device of FIG. 1 is exemplified but the organic photoelectric device of FIG. 2 may be applied in the same manner.

In the drawing, the first organic photoelectric device 100*a*, the second organic photoelectric device 100*b*, and the third organic photoelectric device 100*c* are sequentially stacked, but the present disclosure is not limited thereto, and they may be stacked in various orders.

As described above, the first organic photoelectric device 100*a*, the second organic photoelectric device 100*b*, and the third organic photoelectric device 100*c* have a stack structure, and thus the size of an image sensor may be reduced to realize a smaller image sensor.

The organic photoelectric device and the image sensor may be applied to various electronic devices, for example a mobile phone or a digital camera, but are not limited thereto.

Hereinafter, example embodiments are illustrated in more detail with reference to examples. However, these examples are exemplary, and the present disclosure is not limited thereto.

Photoelectric Conversion Material

Thirty absorption materials selectively absorbing light in a green wavelength region are chosen and classified into Groups 1 and 2 depending on a peak absorption wavelength.

Characteristic of the compounds belonging to Group 1 are shown in Table 1, and characteristic of the compounds belonging to Group 2 are shown in Table 2.

TABLE 1

| No. | $\lambda_{max1}$ (nm) | FWHM (nm) | Abs. coff ($10^4$ cm$^{-1}$) | HOMO (eV) | Energy bandgap (eV) |
|---|---|---|---|---|---|
| Compound 1 | 518 | 84 | 7.1 | 5.76 | 2.06 |
| Compound 2 | 520 | 87 | 7.3 | 5.61 | 2.06 |
| Compound 3 | 522 | 84 | 6.6 | 5.61 | 2.09 |
| Compound 4 | 523 | 88 | 6.7 | 5.55 | 2.08 |
| Compound 5 | 523 | 81 | 9.1 | 5.39 | 2.08 |
| Compound 6 | 523 | 76 | 7.3 | 5.63 | 2.07 |
| Compound 7 | 525 | 76 | 7.4 | 5.68 | 2.09 |
| Compound 8 | 533 | 90 | 6.7 | 5.65 | 2.07 |
| Compound 9 | 534 | 81 | 6.7 | 5.70 | 2.04 |
| Compound 10 | 534 | 87 | 8.8 | 5.65 | 2.03 |
| Compound 11 | 535 | 78 | 6.7 | 5.57 | 2.04 |
| Compound 12 | 536 | 88 | 7.5 | 5.64 | 2.04 |
| Compound 13 | 536 | 88 | 7.5 | 5.59 | 2.01 |
| Compound 14 | 537 | 86 | 8.7 | 5.61 | 2.01 |
| Compound 15 | 537 | 81 | 9.5 | 5.66 | 2.04 |

TABLE 2

| No. | $\lambda_{max2}$ (nm) | FWHM (nm) | Abs. coff ($10^4$ cm$^{-1}$) | HOMO (eV) | Energy bandgap (eV) |
|---|---|---|---|---|---|
| Compound 16 | 540 | 86 | 7.1 | 5.61 | 2.01 |
| Compound 17 | 540 | 80 | 6.8 | 5.44 | 2.02 |
| Compound 18 | 543 | 83 | 7.6 | 5.65 | 1.99 |
| Compound 19 | 543 | 87 | 8.3 | 5.59 | 2.02 |
| Compound 20 | 543 | 76 | 7.8 | 5.41 | 2.04 |
| Compound 21 | 544 | 87 | 8.1 | 5.54 | 2.02 |
| Compound 22 | 550 | 90 | 7.9 | 5.59 | 1.95 |
| Compound 23 | 550 | 87 | 6.9 | 5.62 | 1.96 |
| Compound 24 | 551 | 82 | 7.9 | 5.68 | 2.03 |
| Compound 25 | 551 | 88 | 7.5 | 5.55 | 1.98 |
| Compound 26 | 552 | 85 | 8.2 | 5.46 | 1.95 |
| Compound 27 | 554 | 83 | 8.1 | 5.62 | 1.99 |
| Compound 28 | 554 | 85 | 8.2 | 5.48 | 1.99 |
| Compound 29 | 557 | 84 | 7.3 | 5.44 | 1.94 |
| Compound 30 | 557 | 83 | 7.7 | 5.40 | 1.98 |

Design of Image Sensor

Examples 1 to 105

An image sensor having a stacking structure shown in FIGS. 4 and 5 is designed.

The image sensor includes a photoelectric conversion layer formed by using a first photoelectric conversion material (a p-type semiconductor, P1) selected from Group 1, a second photoelectric conversion material (a p-type semiconductor, P2) selected from Group 2, and fullerene (C60, an n-type semiconductor, N) in a volume ratio of 0.5:0.5:1.

The first photoelectric conversion material and the second photoelectric conversion material are shown in Tables 3 to 17.

Comparative Examples 1 to 119

An image sensor having a stacking structure shown in FIGS. 4 and 5 is designed.

The image sensor includes a photoelectric conversion layer formed by using a mixture of a first photoelectric conversion material (a p-type semiconductor, P1) selected from Group 1 and fullerene (C60, an n-type semiconductor, N) in a volume ratio of 1:1 or a mixture of a second photoelectric conversion material (p-type semiconductor, P2) selected from Group 2 and fullerene (C60, n-type semiconductor, N) in a volume ratio of 1:1.

The first photoelectric conversion material or the second photoelectric conversion material is shown in Tables 3 to 17.

Evaluation

YSNR10 of the image sensors according to Examples and Comparative Examples is evaluated.

YSNR10 of an image sensor is roughness (unit: lux) in which a ratio between signal and noise (signal/noise) is 10, and herein, the signal indicates sensitivity of a signal obtained by color-correcting RGB raw signals calculated in a finite difference time domain method (FDTD) through a color correction matrix (CCM), and the noise is generated when the signal is measured in the image sensor. The color correction is a process of reducing a difference between the RGB raw signals obtained from the image sensor and actual colors by image-processing the RGB raw signals. As YSNR10 is smaller, image characteristics may be satisfactory at low roughness.

The results are shown in Tables 3 to 17.

TABLE 3

| | P1 | P2 | N | $\lambda_{max}$ (nm) | FWHM (nm) | YSNR10 |
|---|---|---|---|---|---|---|
| Example 1 | Compound 1 | Compound 22 | $C_{60}$ | 533 | 109 | 108.4 |
| Example 2 | Compound 1 | Compound 26 | $C_{60}$ | 541 | 104 | 108.3 |
| Comparative Example 1 | Compound 1 | — | $C_{60}$ | 518 | 84 | 133.3 |
| Comparative Example 2 | — | Compound 22 | $C_{60}$ | 550 | 90 | 111.9 |
| Comparative Example 3 | — | Compound 26 | $C_{60}$ | 552 | 85 | 109.0 |

TABLE 4

| | P1 | P2 | N | $\lambda_{max}$ (nm) | FWHM (nm) | YSNR10 |
|---|---|---|---|---|---|---|
| Example 3 | Compound 2 | Compound 22 | $C_{60}$ | 533 | 103 | 104.1 |
| Example 4 | Compound 2 | Compound 23 | $C_{60}$ | 541 | 105 | 104.3 |
| Example 5 | Compound 2 | Compound 26 | $C_{60}$ | 541 | 99 | 102.9 |
| Example 6 | Compound 2 | Compound 27 | $C_{60}$ | 546 | 106 | 103.6 |
| Example 7 | Compound 2 | Compound 28 | $C_{60}$ | 542 | 106 | 105.4 |

TABLE 4-continued

|  | P1 | P2 | N | $\lambda_{max}$ (nm) | FWHM (nm) | YSNR10 |
|---|---|---|---|---|---|---|
| Comparative Example 4 | Compound 2 | — | $C_{60}$ | 520 | 87 | 117.4 |
| Comparative Example 5 | — | Compound 22 | $C_{60}$ | 550 | 90 | 111.9 |
| Comparative Example 6 | — | Compound 23 | $C_{60}$ | 550 | 87 | 108.6 |
| Comparative Example 7 | — | Compound 26 | $C_{60}$ | 552 | 85 | 109.0 |
| Comparative Example 8 | — | Compound 27 | $C_{60}$ | 554 | 83 | 104.0 |
| Comparative Example 9 | — | Compound 28 | $C_{60}$ | 554 | 85 | 112.4 |

TABLE 5

|  | P1 | P2 | N | $\lambda_{max}$ (nm) | FWHM (nm) | YSNR10 |
|---|---|---|---|---|---|---|
| Example 8 | Compound 3 | Compound 22 | $C_{60}$ | 533 | 109 | 111.9 |
| Example 9 | Compound 3 | Compound 26 | $C_{60}$ | 541 | 104 | 107.6 |
| Example 10 | Compound 3 | Compound 28 | $C_{60}$ | 545 | 111 | 111.3 |
| Example 11 | Compound 3 | Compound 29 | $C_{60}$ | 545 | 111 | 126.8 |
| Comparative Example 10 | Compound 3 | — | $C_{60}$ | 522 | 84 | 144.9 |
| Comparative Example 11 | — | Compound 22 | $C_{60}$ | 550 | 90 | 111.9 |
| Comparative Example 12 | — | Compound 26 | $C_{60}$ | 552 | 85 | 109.0 |
| Comparative Example 13 | — | Compound 28 | $C_{60}$ | 554 | 85 | 112.4 |
| Comparative Example 14 | — | Compound 29 | $C_{60}$ | 557 | 84 | 157.5 |

TABLE 6

|  | P1 | P2 | N | $\lambda_{max}$ (nm) | FWHM (nm) | YSNR10 |
|---|---|---|---|---|---|---|
| Example 12 | Compound 4 | Compound 22 | $C_{60}$ | 533 | 111 | 107.2 |
| Example 13 | Compound 4 | Compound 23 | $C_{60}$ | 541 | 111 | 108.0 |
| Example 14 | Compound 4 | Compound 26 | $C_{60}$ | 541 | 106 | 107.6 |
| Example 15 | Compound 4 | Compound 29 | $C_{60}$ | 541 | 114 | 128.1 |
| Comparative Example 15 | Compound 4 | — | $C_{60}$ | 523 | 88 | 133.5 |
| Comparative Example 16 | — | Compound 22 | $C_{60}$ | 550 | 90 | 111.9 |
| Comparative Example 17 | — | Compound 23 | $C_{60}$ | 550 | 87 | 108.6 |
| Comparative Example 18 | — | Compound 26 | $C_{60}$ | 552 | 85 | 109.0 |
| Comparative Example 19 | — | Compound 29 | $C_{60}$ | 557 | 84 | 157.5 |

TABLE 7

|  | P1 | P2 | N | $\lambda_{max}$ (nm) | FWHM (nm) | YSNR10 |
|---|---|---|---|---|---|---|
| Example 16 | Compound 5 | Compound 22 | $C_{60}$ | 536 | 103 | 103.8 |
| Example 17 | Compound 5 | Compound 23 | $C_{60}$ | 546 | 103 | 104.4 |
| Example 18 | Compound 5 | Compound 26 | $C_{60}$ | 541 | 98 | 101.8 |
| Example 19 | Compound 5 | Compound 27 | $C_{60}$ | 546 | 103 | 103.4 |
| Example 20 | Compound 5 | Compound 28 | $C_{60}$ | 546 | 104 | 105.1 |
| Example 21 | Compound 5 | Compound 29 | $C_{60}$ | 546 | 106 | 117.9 |

TABLE 7-continued

|  | P1 | P2 | N | $\lambda_{max}$ (nm) | FWHM (nm) | YSNR10 |
|---|---|---|---|---|---|---|
| Comparative Example 20 | Compound 5 | — | $C_{60}$ | 523 | 81 | 129.0 |
| Comparative Example 21 | — | Compound 22 | $C_{60}$ | 550 | 90 | 111.9 |
| Comparative Example 22 | — | Compound 23 | $C_{60}$ | 550 | 87 | 108.6 |
| Comparative Example 23 | — | Compound 26 | $C_{60}$ | 552 | 85 | 109.0 |
| Comparative Example 24 | — | Compound 27 | $C_{60}$ | 554 | 83 | 104.0 |
| Comparative Example 25 | — | Compound 28 | $C_{60}$ | 554 | 85 | 112.4 |
| Comparative Example 26 | — | Compound 29 | $C_{60}$ | 557 | 84 | 157.5 |

TABLE 8

|  | P1 | P2 | N | $\lambda_{max}$ (nm) | FWHM (nm) | YSNR10 |
|---|---|---|---|---|---|---|
| Example 22 | Compound 6 | Compound 17 | $C_{60}$ | 537 | 115 | 99.8 |
| Example 23 | Compound 6 | Compound 18 | $C_{60}$ | 536 | 117 | 97.8 |
| Example 24 | Compound 6 | Compound 19 | $C_{60}$ | 539 | 116 | 97.1 |
| Example 25 | Compound 6 | Compound 20 | $C_{60}$ | 534 | 114 | 97.1 |
| Example 26 | Compound 6 | Compound 21 | $C_{60}$ | 537 | 109 | 96.1 |
| Example 27 | Compound 6 | Compound 22 | $C_{60}$ | 533 | 112 | 100.2 |
| Example 28 | Compound 6 | Compound 23 | $C_{60}$ | 545 | 111 | 100.3 |
| Example 29 | Compound 6 | Compound 24 | $C_{60}$ | 545 | 109 | 94.0 |
| Example 30 | Compound 6 | Compound 25 | $C_{60}$ | 545 | 114 | 96.2 |
| Example 31 | Compound 6 | Compound 26 | $C_{60}$ | 541 | 106 | 94.8 |
| Example 32 | Compound 6 | Compound 27 | $C_{60}$ | 547 | 113 | 94.6 |
| Example 33 | Compound 6 | Compound 28 | $C_{60}$ | 545 | 113 | 96.3 |
| Example 34 | Compound 6 | Compound 30 | $C_{60}$ | 543 | 113 | 93.3 |
| Comparative Example 27 | Compound 6 | — | $C_{60}$ | 523 | 76 | 104.5 |
| Comparative Example 28 | — | Compound 17 | $C_{60}$ | 540 | 80 | 102.3 |
| Comparative Example 29 | — | Compound 18 | $C_{60}$ | 543 | 83 | 99.7 |
| Comparative Example 30 | — | Compound 19 | $C_{60}$ | 543 | 87 | 99.1 |
| Comparative Example 31 | — | Compound 20 | $C_{60}$ | 543 | 76 | 98.5 |
| Comparative Example 32 | — | Compound 21 | $C_{60}$ | 544 | 87 | 101.1 |
| Comparative Example 33 | — | Compound 22 | $C_{60}$ | 550 | 90 | 111.9 |
| Comparative Example 34 | — | Compound 23 | $C_{60}$ | 550 | 87 | 108.6 |
| Comparative Example 35 | — | Compound 24 | $C_{60}$ | 551 | 82 | 98.6 |
| Comparative Example 36 | — | Compound 25 | $C_{60}$ | 551 | 88 | 96.6 |
| Comparative Example 37 | — | Compound 26 | $C_{60}$ | 552 | 85 | 109.0 |
| Comparative Example 38 | — | Compound 27 | $C_{60}$ | 554 | 83 | 104.0 |
| Comparative Example 39 | — | Compound 28 | $C_{60}$ | 554 | 85 | 112.4 |
| Comparative Example 40 | — | Compound 30 | $C_{60}$ | 557 | 83 | 95.9 |

TABLE 9

|  | P1 | P2 | N | $\lambda_{max}$ (nm) | FWHM (nm) | YSNR10 |
|---|---|---|---|---|---|---|
| Example 35 | Compound 7 | Compound 22 | $C_{60}$ | 537 | 125 | 105.2 |
| Example 36 | Compound 7 | Compound 23 | $C_{60}$ | 551 | 119 | 106.4 |
| Example 37 | Compound 7 | Compound 26 | $C_{60}$ | 547 | 114 | 99.2 |

TABLE 9-continued

|  | P1 | P2 | N | $\lambda_{max}$ (nm) | FWHM (nm) | YSNR10 |
|---|---|---|---|---|---|---|
| Example 38 | Compound 7 | Compound 27 | $C_{60}$ | 552 | 118 | 100.1 |
| Example 39 | Compound 7 | Compound 28 | $C_{60}$ | 550 | 119 | 102.1 |
| Example 40 | Compound 7 | Compound 29 | $C_{60}$ | 547 | 121 | 116.5 |
| Comparative Example 41 | Compound 7 | — | $C_{60}$ | 525 | 76 | 126.2 |
| Comparative Example 42 | — | Compound 22 | $C_{60}$ | 550 | 90 | 111.9 |
| Comparative Example 43 | — | Compound 23 | $C_{60}$ | 550 | 87 | 108.6 |
| Comparative Example 44 | — | Compound 26 | $C_{60}$ | 552 | 85 | 109.0 |
| Comparative Example 45 | — | Compound 27 | $C_{60}$ | 554 | 83 | 104.0 |
| Comparative Example 46 | — | Compound 28 | $C_{60}$ | 554 | 85 | 112.4 |
| Comparative Example 47 | — | Compound 29 | $C_{60}$ | 557 | 84 | 157.5 |

TABLE 10

|  | P1 | P2 | N | $\lambda_{max}$ (nm) | FWHM (nm) | YSNR10 |
|---|---|---|---|---|---|---|
| Example 41 | Compound 8 | Compound 22 | $C_{60}$ | 537 | 116 | 100.2 |
| Example 42 | Compound 8 | Compound 26 | $C_{60}$ | 547 | 108 | 101.0 |
| Comparative Example 48 | Compound 8 | — | $C_{60}$ | 533 | 90 | 104.4 |
| Comparative Example 49 | — | Compound 22 | $C_{60}$ | 550 | 90 | 111.9 |
| Comparative Example 50 | — | Compound 26 | $C_{60}$ | 552 | 85 | 109.0 |

TABLE 11

|  | P1 | P2 | N | $\lambda_{max}$ (nm) | FWHM (nm) | YSNR10 |
|---|---|---|---|---|---|---|
| Example 43 | Compound 9 | Compound 22 | $C_{60}$ | 543 | 108 | 105.5 |
| Example 44 | Compound 9 | Compound 23 | $C_{60}$ | 548 | 105 | 105.1 |
| Example 45 | Compound 9 | Compound 26 | $C_{60}$ | 547 | 99 | 101.6 |
| Example 46 | Compound 9 | Compound 27 | $C_{60}$ | 549 | 103 | 100.8 |
| Example 47 | Compound 9 | Compound 28 | $C_{60}$ | 548 | 106 | 102.5 |
| Example 48 | Compound 9 | Compound 29 | $C_{60}$ | 546 | 107 | 118.2 |
| Comparative Example 51 | Compound 9 | — | $C_{60}$ | 534 | 81 | 109.4 |
| Comparative Example 52 | — | Compound 22 | $C_{60}$ | 550 | 90 | 111.9 |
| Comparative Example 53 | — | Compound 23 | $C_{60}$ | 550 | 87 | 108.6 |
| Comparative Example 54 | — | Compound 26 | $C_{60}$ | 552 | 85 | 109.0 |
| Comparative Example 55 | — | Compound 27 | $C_{60}$ | 554 | 83 | 104.0 |
| Comparative Example 56 | — | Compound 28 | $C_{60}$ | 554 | 85 | 112.4 |
| Comparative Example 57 | — | Compound 29 | $C_{60}$ | 557 | 84 | 157.5 |

TABLE 12

|  | P1 | P2 | N | $\lambda_{max}$ (nm) | FWHM (nm) | YSNR10 |
|---|---|---|---|---|---|---|
| Example 49 | Compound 10 | Compound 16 | $C_{60}$ | 541 | 122 | 97.1 |
| Example 50 | Compound 10 | Compound 17 | $C_{60}$ | 541 | 119 | 99.8 |
| Example 51 | Compound 10 | Compound 18 | $C_{60}$ | 539 | 121 | 98.8 |

TABLE 12-continued

|  | P1 | P2 | N | $\lambda_{max}$ (nm) | FWHM (nm) | YSNR10 |
|---|---|---|---|---|---|---|
| Example 52 | Compound 10 | Compound 21 | $C_{60}$ | 541 | 113 | 98.6 |
| Example 53 | Compound 10 | Compound 23 | $C_{60}$ | 548 | 113 | 101.5 |
| Example 54 | Compound 10 | Compound 24 | $C_{60}$ | 546 | 110 | 96.9 |
| Example 55 | Compound 10 | Compound 25 | $C_{60}$ | 548 | 116 | 95.1 |
| Example 56 | Compound 10 | Compound 26 | $C_{60}$ | 548 | 108 | 97.4 |
| Example 57 | Compound 10 | Compound 27 | $C_{60}$ | 553 | 113 | 97.4 |
| Example 58 | Compound 10 | Compound 28 | $C_{60}$ | 548 | 114 | 98.9 |
| Example 59 | Compound 10 | Compound 30 | $C_{60}$ | 546 | 115 | 95.1 |
| Comparative Example 58 | Compound 10 | — | $C_{60}$ | 534 | 87 | 100.2 |
| Comparative Example 59 | — | Compound 16 | $C_{60}$ | 540 | 86 | 111.9 |
| Comparative Example 60 | — | Compound 17 | $C_{60}$ | 540 | 80 | 102.3 |
| Comparative Example 61 | — | Compound 18 | $C_{60}$ | 543 | 83 | 99.7 |
| Comparative Example 62 | — | Compound 21 | $C_{60}$ | 544 | 87 | 101.1 |
| Comparative Example 63 | — | Compound 23 | $C_{60}$ | 550 | 87 | 108.6 |
| Comparative Example 64 | — | Compound 24 | $C_{60}$ | 551 | 82 | 98.6 |
| Comparative Example 65 | — | Compound 25 | $C_{60}$ | 551 | 88 | 96.6 |
| Comparative Example 66 | — | Compound 26 | $C_{60}$ | 552 | 85 | 109.0 |
| Comparative Example 67 | — | Compound 27 | $C_{60}$ | 554 | 83 | 104.0 |
| Comparative Example 68 | — | Compound 28 | $C_{60}$ | 554 | 85 | 112.4 |
| Comparative Example 69 | — | Compound 30 | $C_{60}$ | 557 | 83 | 95.9 |

TABLE 13

|  | P1 | P2 | N | $\lambda_{max}$ (nm) | FWHM (nm) | YSNR10 |
|---|---|---|---|---|---|---|
| Example 60 | Compound 11 | Compound 22 | $C_{60}$ | 543 | 121 | 104.6 |
| Example 61 | Compound 11 | Compound 23 | $C_{60}$ | 551 | 117 | 104.2 |
| Example 62 | Compound 11 | Compound 25 | $C_{60}$ | 550 | 119 | 96.2 |
| Example 63 | Compound 11 | Compound 26 | $C_{60}$ | 550 | 112 | 102.7 |
| Example 64 | Compound 11 | Compound 27 | $C_{60}$ | 554 | 116 | 101.7 |
| Example 65 | Compound 11 | Compound 28 | $C_{60}$ | 553 | 117 | 103.5 |
| Comparative Example 70 | Compound 11 | — | $C_{60}$ | 535 | 78 | 107.8 |
| Comparative Example 71 | — | Compound 22 | $C_{60}$ | 550 | 90 | 111.9 |
| Comparative Example 72 | — | Compound 23 | $C_{60}$ | 550 | 87 | 108.6 |
| Comparative Example 73 | — | Compound 25 | $C_{60}$ | 551 | 88 | 96.6 |
| Comparative Example 74 | — | Compound 26 | $C_{60}$ | 552 | 85 | 109.0 |
| Comparative Example 75 | — | Compound 27 | $C_{60}$ | 554 | 83 | 104.0 |
| Comparative Example 76 | — | Compound 28 | $C_{60}$ | 554 | 85 | 112.4 |

TABLE 14

|  | P1 | P2 | N | $\lambda_{max}$ (nm) | FWHM (nm) | YSNR10 |
|---|---|---|---|---|---|---|
| Example 66 | Compound 12 | Compound 17 | $C_{60}$ | 546 | 117 | 100.2 |
| Example 67 | Compound 12 | Compound 18 | $C_{60}$ | 541 | 119 | 98.9 |
| Example 68 | Compound 12 | Compound 19 | $C_{60}$ | 542 | 118 | 98.5 |
| Example 69 | Compound 12 | Compound 20 | $C_{60}$ | 538 | 119 | 98.1 |

TABLE 14-continued

|  | P1 | P2 | N | $\lambda_{max}$ (nm) | FWHM (nm) | YSNR10 |
|---|---|---|---|---|---|---|
| Example 70 | Compound 12 | Compound 21 | $C_{60}$ | 541 | 112 | 97.5 |
| Example 71 | Compound 12 | Compound 22 | $C_{60}$ | 537 | 116 | 102.2 |
| Example 72 | Compound 12 | Compound 23 | $C_{60}$ | 551 | 111 | 101.8 |
| Example 73 | Compound 12 | Compound 24 | $C_{60}$ | 550 | 109 | 95.8 |
| Example 74 | Compound 12 | Compound 26 | $C_{60}$ | 550 | 106 | 97.0 |
| Example 75 | Compound 12 | Compound 27 | $C_{60}$ | 553 | 110 | 96.6 |
| Example 76 | Compound 12 | Compound 28 | $C_{60}$ | 552 | 112 | 98.2 |
| Example 77 | Compound 12 | Compound 30 | $C_{60}$ | 547 | 113 | 95.4 |
| Comparative Example 77 | Compound 12 | — | $C_{60}$ | 536 | 88 | 104.0 |
| Comparative Example 78 | — | Compound 17 | $C_{60}$ | 540 | 80 | 102.3 |
| Comparative Example 79 | — | Compound 18 | $C_{60}$ | 543 | 83 | 99.7 |
| Comparative Example 80 | — | Compound 19 | $C_{60}$ | 543 | 87 | 99.1 |
| Comparative Example 81 | — | Compound 20 | $C_{60}$ | 543 | 76 | 98.5 |
| Comparative Example 82 | — | Compound 21 | $C_{60}$ | 544 | 87 | 101.1 |
| Comparative Example 83 | — | Compound 22 | $C_{60}$ | 550 | 90 | 111.9 |
| Comparative Example 84 | — | Compound 23 | $C_{60}$ | 550 | 87 | 108.6 |
| Comparative Example 85 | — | Compound 24 | $C_{60}$ | 551 | 82 | 98.6 |
| Comparative Example 86 | — | Compound 26 | $C_{60}$ | 552 | 85 | 109.0 |
| Comparative Example 87 | — | Compound 27 | $C_{60}$ | 554 | 83 | 104.0 |
| Comparative Example 88 | — | Compound 28 | $C_{60}$ | 554 | 85 | 112.4 |
| Comparative Example 89 | — | Compound 30 | $C_{60}$ | 557 | 83 | 95.9 |

TABLE 15

|  | P1 | P2 | N | $\lambda_{max}$ (nm) | FWHM (nm) | YSNR10 |
|---|---|---|---|---|---|---|
| Example 78 | Compound 13 | Compound 17 | $C_{60}$ | 543 | 118 | 100.8 |
| Example 79 | Compound 13 | Compound 21 | $C_{60}$ | 541 | 112 | 98.2 |
| Example 80 | Compound 13 | Compound 24 | $C_{60}$ | 548 | 110 | 96.8 |
| Example 81 | Compound 13 | Compound 25 | $C_{60}$ | 548 | 115 | 96.1 |
| Example 82 | Compound 13 | Compound 26 | $C_{60}$ | 548 | 107 | 98.6 |
| Example 83 | Compound 13 | Compound 27 | $C_{60}$ | 552 | 112 | 97.8 |
| Example 84 | Compound 13 | Compound 28 | $C_{60}$ | 552 | 113 | 99.3 |
| Comparative Example 90 | Compound 13 | — | $C_{60}$ | 536 | 88 | 100.3 |
| Comparative Example 91 | — | Compound 17 | $C_{60}$ | 540 | 80 | 102.3 |
| Comparative Example 92 | — | Compound 21 | $C_{60}$ | 544 | 87 | 101.1 |
| Comparative Example 93 | — | Compound 24 | $C_{60}$ | 551 | 82 | 98.6 |
| Comparative Example 94 | — | Compound 25 | $C_{60}$ | 551 | 88 | 96.6 |
| Comparative Example 95 | — | Compound 26 | $C_{60}$ | 552 | 85 | 109.0 |
| Comparative Example 96 | — | Compound 27 | $C_{60}$ | 554 | 83 | 104.0 |
| Comparative Example 97 | — | Compound 28 | $C_{60}$ | 554 | 85 | 112.4 |

TABLE 16

| | P1 | P2 | N | $\lambda_{max}$ (nm) | FWHM (nm) | YSNR10 |
|---|---|---|---|---|---|---|
| Example 85 | Compound 14 | Compound 16 | $C_{60}$ | 551 | 134 | 97.1 |
| Example 86 | Compound 14 | Compound 17 | $C_{60}$ | 551 | 132 | 99.9 |
| Example 87 | Compound 14 | Compound 18 | $C_{60}$ | 546 | 137 | 99.0 |
| Example 89 | Compound 14 | Compound 22 | $C_{60}$ | 543 | 131 | 103.0 |
| Example 90 | Compound 14 | Compound 23 | $C_{60}$ | 554 | 123 | 102.0 |
| Example 91 | Compound 14 | Compound 25 | $C_{60}$ | 553 | 124 | 95.3 |
| Example 92 | Compound 14 | Compound 26 | $C_{60}$ | 553 | 117 | 102.0 |
| Example 93 | Compound 14 | Compound 27 | $C_{60}$ | 557 | 120 | 101.7 |
| Example 94 | Compound 14 | Compound 28 | $C_{60}$ | 556 | 122 | 103.2 |
| Example 95 | Compound 14 | Compound 30 | $C_{60}$ | 551 | 123 | 95.4 |
| Comparative Example 98 | Compound 14 | — | $C_{60}$ | 537 | 86 | 104.0 |
| Comparative Example 99 | — | Compound 16 | $C_{60}$ | 540 | 86 | 97.7 |
| Comparative Example100 | — | Compound 17 | $C_{60}$ | 540 | 80 | 102.3 |
| Comparative Example101 | — | Compound 18 | $C_{60}$ | 543 | 83 | 99.7 |
| Comparative Example102 | — | Compound 22 | $C_{60}$ | 550 | 90 | 111.9 |
| Comparative Example103 | — | Compound 23 | $C_{60}$ | 550 | 87 | 108.6 |
| Comparative Example104 | — | Compound 25 | $C_{60}$ | 551 | 88 | 96.6 |
| Comparative Example105 | — | Compound 26 | $C_{60}$ | 552 | 85 | 109.0 |
| Comparative Example106 | — | Compound 27 | $C_{60}$ | 554 | 83 | 104.0 |
| Comparative Example107 | — | Compound 28 | $C_{60}$ | 554 | 85 | 112.4 |
| Comparative Example108 | — | Compound 30 | $C_{60}$ | 557 | 83 | 95.9 |

TABLE 17

| | P1 | P2 | N | $\lambda_{max}$ (nm) | FWHM (nm) | YSNR10 |
|---|---|---|---|---|---|---|
| Example 96 | Compound 15 | Compound 16 | $C_{60}$ | 547 | 119 | 96.7 |
| Example 97 | Compound 15 | Compound 17 | $C_{60}$ | 541 | 117 | 99.5 |
| Example 98 | Compound 15 | Compound 18 | $C_{60}$ | 538 | 119 | 98.4 |
| Example 99 | Compound 15 | Compound 22 | $C_{60}$ | 537 | 114 | 101.6 |
| Example100 | Compound 15 | Compound 23 | $C_{60}$ | 547 | 112 | 100.8 |
| Example101 | Compound 15 | Compound 25 | $C_{60}$ | 547 | 114 | 94.4 |
| Example102 | Compound 15 | Compound 26 | $C_{60}$ | 547 | 106 | 100.2 |
| Example103 | Compound 15 | Compound 27 | $C_{60}$ | 552 | 111 | 100.6 |
| Example104 | Compound 15 | Compound 28 | $C_{60}$ | 550 | 112 | 102.1 |
| Example105 | Compound 15 | Compound 30 | $C_{60}$ | 544 | 113 | 94.4 |
| Comparative Example109 | Compound 15 | — | $C_{60}$ | 537 | 81 | 104.4 |
| Comparative Example110 | — | Compound 16 | $C_{60}$ | 540 | 86 | 97.7 |
| Comparative Example111 | — | Compound 17 | $C_{60}$ | 540 | 80 | 102.3 |
| Comparative Example112 | — | Compound 18 | $C_{60}$ | 543 | 83 | 99.7 |
| Comparative Example113 | — | Compound 22 | $C_{60}$ | 550 | 90 | 111.9 |
| Comparative Example114 | — | Compound 23 | $C_{60}$ | 550 | 87 | 108.6 |
| Comparative Example115 | — | Compound 25 | $C_{60}$ | 551 | 88 | 96.6 |
| Comparative Example116 | — | Compound 26 | $C_{60}$ | 552 | 85 | 109.0 |
| Comparative Example117 | — | Compound 27 | $C_{60}$ | 554 | 83 | 104.0 |
| Comparative Example118 | — | Compound 28 | $C_{60}$ | 554 | 85 | 112.4 |
| Comparative Example119 | — | Compound 30 | $C_{60}$ | 557 | 83 | 95.9 |

Manufacture of Organic Photoelectric Device

Preparation Example 1

A 150 nm-thick anode is formed by sputtering ITO on a glass substrate. Subsequently, a 5 nm-thick electron blocking layer is formed by depositing Compound represented by Chemical Formula A on the anode. On the electron blocking layer, a 100 nm-thick photoelectric conversion layer is formed by codepositing Compound 6(P1) represented by Chemical Formula B C Compound 30(P2) represented by chemical Formula C as a p-type semiconductor and $C_{60}$(N) as an n-type semiconductor. Herein, P1:P2:N are codeposited in a volume ratio of 0.5:0.5:1. Subsequently, on the photoelectric conversion layer, a 7 nm-thick cathode is formed by sputtering ITO. On the cathode, a 50 nm-thick anti-reflection layer is formed by depositing aluminum oxide ($Al_2O_3$), and a glass plate is used for sealing to manufacture an organic photoelectric device.

Preparation Example 2

An organic photoelectric device is manufactured according to the same method as Preparation Example 1 except for forming a photoelectric conversion layer by codepositing Compound 9(P1) represented by Chemical Formula D and Compound 26(P2) represented by Chemical Formula E as a p-type semiconductor and $C_{60}$(N) as an n-type semiconductor.

[Chemical Formula D]

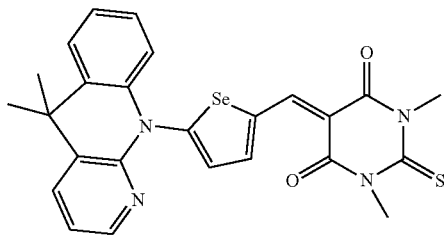

[Chemical Formula A]

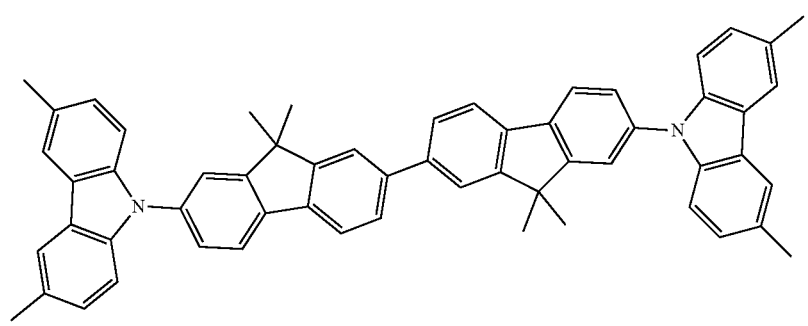

[Chemical Formula B]

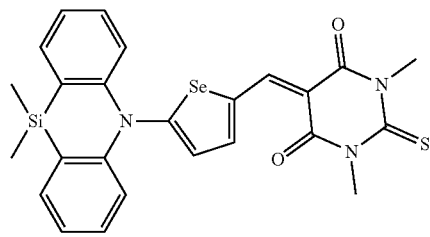

[Chemical Formula C]

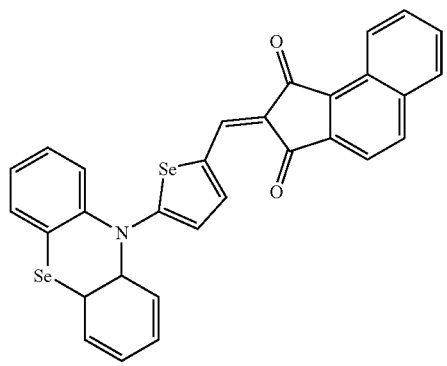

[Chemical Formula E]

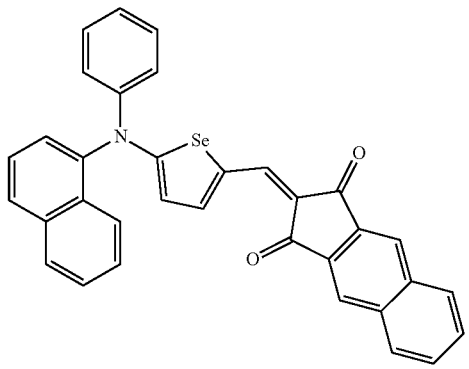

Comparative Preparation Example 1

An organic photoelectric device is manufactured according to the same method as Preparation Example 1 except for using Compound 6 (P1) represented by Chemical Formula B as a p-type semiconductor.

Comparative Preparation Example 2

An organic photoelectric device is manufactured according to the same method as Preparation Example 1 except for using Compound 30 (P2) represented by Chemical Formula C as a p-type semiconductor.

Comparative Preparation Example 3

An organic photoelectric device is manufactured according to the same method as Preparation Example 2 except for using Compound 9 (P1) represented by Chemical Formula D as a p-type semiconductor.

Comparative Preparation Example 4

An organic photoelectric device is manufactured according to the same method as Preparation Example 2 except for using Compound 26 (P2) represented by Chemical Formula B as a p-type semiconductor.

Evaluation II

Light absorption characteristics of the organic photoelectric devices according to Preparation Examples 1 and 2 and Comparative Preparation Examples 1 to 4 are examined.

Figure 9:
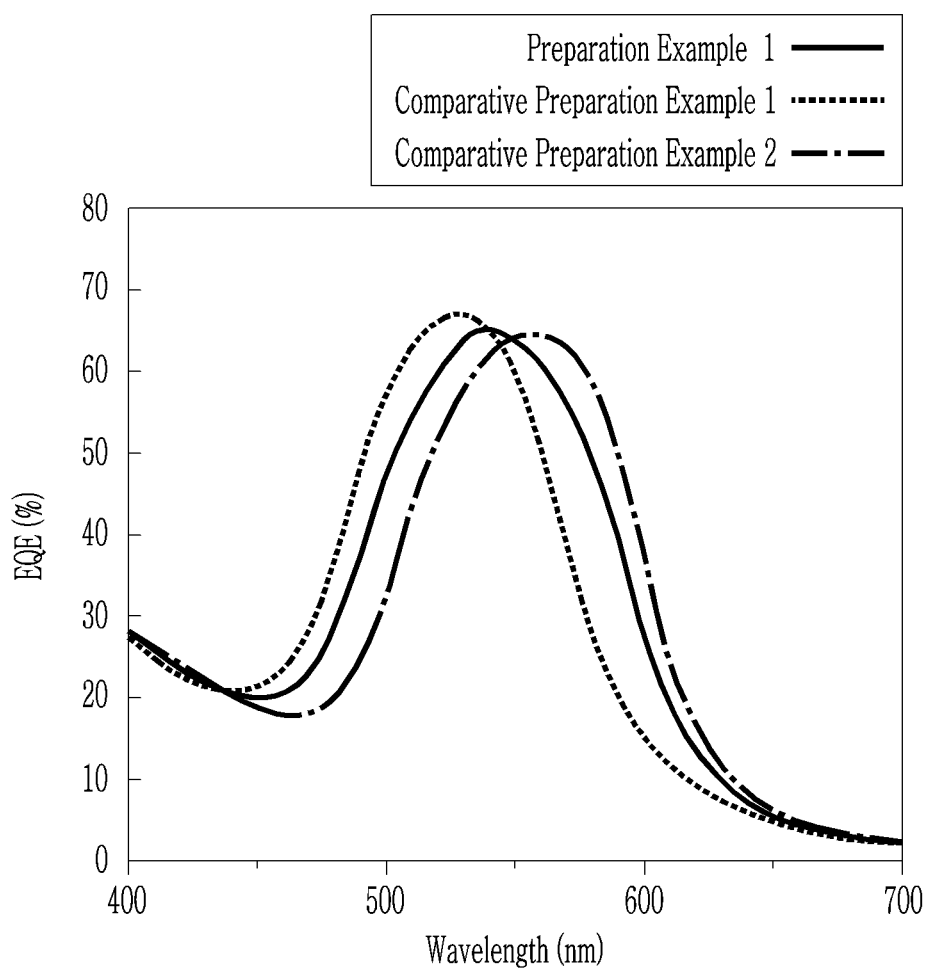
FIG. 9 shows absorption spectra of the organic photoelectric devices according to Preparation Example 1 and Comparative Preparation Examples 1 and 2.
Figure 10:
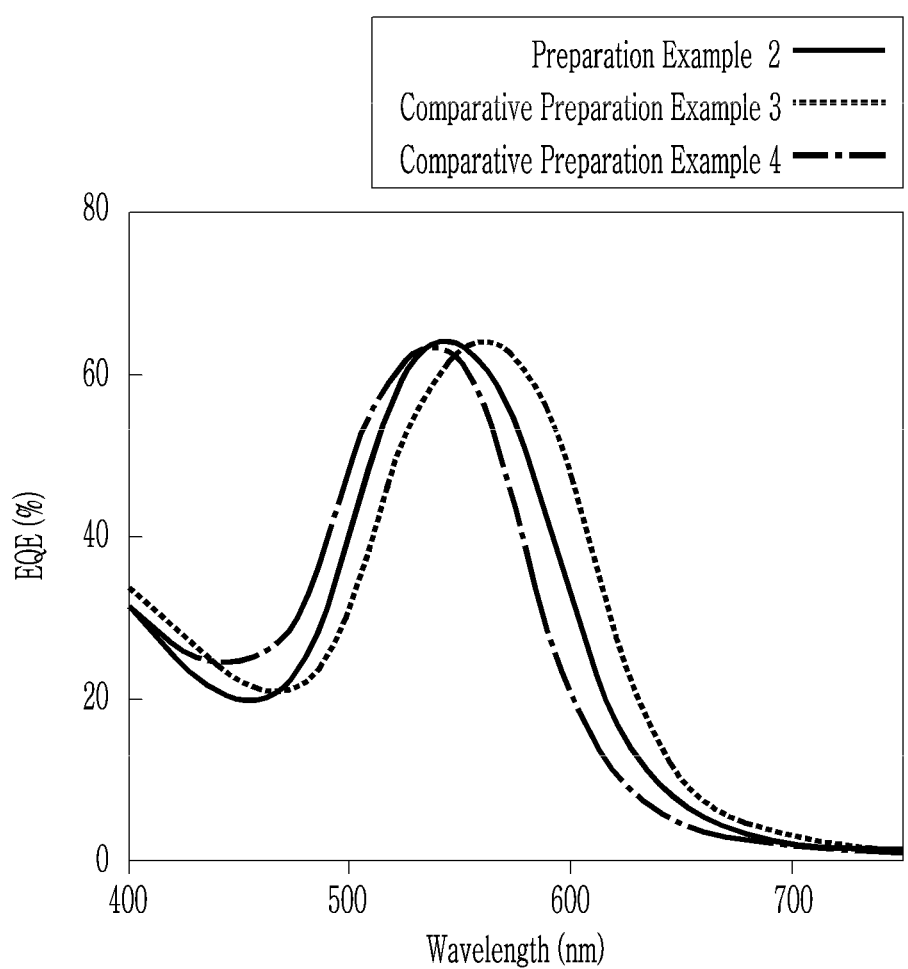
FIG. 10 shows absorption spectra of the organic photoelectric devices according to Preparation Example 2 and Comparative Preparation Examples 3 and 4.

The results are shown in FIGS. 9 and 10 and Tables 18 and 19.

FIG. 9 shows absorption spectra of the organic photoelectric devices according to Preparation Example 1 and Comparative Preparation Examples 1 and 2, and FIG. 10 shows absorption spectra of the organic photoelectric devices according to Preparation Example 2 and Comparative Preparation Examples 3 and 4.

TABLE 18

| | P1 | P2 | N | $\lambda_{max}$ (nm) | FWHM (nm) | YSNR10 |
|---|---|---|---|---|---|---|
| Preparation Example 1 | Compound 6 | Compound 26 | $C_{60}$ | 540 | 110 | 93 |
| Comparative Preparation Example 1 | Compound 6 | — | $C_{60}$ | 530 | 100 | 96 |
| Comparative Preparation Example 2 | — | Compound 26 | $C_{60}$ | 560 | 105 | 104 |

Referring to FIG. 9 and Table 18, a peak absorption wavelength of the organic photoelectric device according to Preparation Example 1 is present between peak absorption wavelengths of the organic photoelectric devices according to Comparative Preparation Examples 1 and 2, and YSNR10 of the organic photoelectric device according to Preparation Example 1 is improved.

TABLE 19

| | P1 | P2 | N | $\lambda_{max}$ (nm) | FWHM (nm) | YSNR10 |
|---|---|---|---|---|---|---|
| Preparation Example 2 | Compound 9 | Compound 26 | $C_{60}$ | 540 | 110 | 99 |
| Comparative Preparation Example 3 | Compound 9 | — | $C_{60}$ | 538 | 105 | 109 |
| Comparative Preparation Example 4 | — | Compound 26 | $C_{60}$ | 560 | 115 | 109 |

Referring to FIG. 10 and Table 19, a peak absorption wavelength of the organic photoelectric device according to Preparation Example 2 is present between peak absorption wavelengths of the organic photoelectric devices according to Comparative Preparation Examples 3 and 4, and YSNR10 of the organic photoelectric device according to Preparation Example 2 is improved.

While this disclosure has been described in connection with what is presently considered to be practical example embodiments, it is to be understood that the invention is not limited to the disclosed example embodiments, but, on the contrary, is intended to cover various modifications and equivalent arrangements included within the spirit and scope of the appended claims.

What is claimed is:

1. An organic photoelectric device, comprising
a first electrode and a second electrode facing each other, and
a photoelectric conversion layer between the first electrode and the second electrode and selectively absorbing light in a green wavelength region,
wherein the photoelectric conversion layer includes at least one first photoelectric conversion material having a peak absorption wavelength ($\lambda_{max1}$) of less than about 540 nm and at least one second photoelectric conversion material having a peak absorption wavelength ($\lambda_{max2}$) of greater than or equal to about 540 nm,
the first photoelectric conversion material has a peak absorption wavelength ($\lambda_{max1}$) of greater than or equal to about 510 nm and less than about 540 nm, and
the second photoelectric conversion material has a peak absorption wavelength ($\lambda_{max2}$) of about 540 nm to about 560 nm.

2. The organic photoelectric device of claim 1, wherein an absorption spectrum of the first photoelectric conversion material and an absorption spectrum of the second photoelectric conversion material overlap at least one part.

3. The organic photoelectric device of claim 1, wherein an average of the peak absorption wavelength ($\lambda_{max1}$) of the first photoelectric conversion material and the peak absorption wavelength ($\lambda_{max2}$) of the second photoelectric conversion material belongs to a range of about 530 nm to about 550 nm.

4. The organic photoelectric device of claim 3, wherein an average of the peak absorption wavelength ($\lambda_{max1}$) of the first photoelectric conversion material and the peak absorption wavelength ($\lambda_{max2}$) of the second photoelectric conversion material belongs to a range of about 535 nm to about 545 nm.

5. The organic photoelectric device of claim 1, wherein each of the first photoelectric conversion material and the second photoelectric conversion material has a light absorption full width at half maximum (FWHM) of less than or equal to about 100 nm.

6. The organic photoelectric device of claim 1, wherein each of the first photoelectric conversion material and the second photoelectric conversion material has a HOMO energy level of about 5.30 eV to about 5.80 eV.

7. The organic photoelectric device of claim 1, wherein each of an extinction coefficient at a peak absorption wavelength ($\lambda_{max1}$) of the first photoelectric conversion material and a peak absorption wavelength ($\lambda_{max2}$) of the second photoelectric conversion material is greater than or equal to about $6.5 \times 10^4$ cm$^{-1}$.

8. The organic photoelectric device of claim 7, wherein each of an extinction coefficient at a peak absorption wavelength ($\lambda_{max1}$) of the first photoelectric conversion material and a peak absorption wavelength ($\lambda_{max2}$) of the second photoelectric conversion material is about $6.5 \times 10^4$ cm$^{-1}$ to about $1.5 \times 10^5$ cm$^{-1}$.

9. The organic photoelectric device of claim 1, wherein a peak absorption wavelength ($\lambda_{max}$) of the photoelectric conversion layer belongs to a range of about 530 nm to about 560 nm.

10. The organic photoelectric device of claim 9, wherein a peak absorption wavelength ($\lambda_{max}$) of the photoelectric conversion layer may belong to a range of about 533 nm to about 550 nm.

11. The organic photoelectric device of claim 1, wherein a light absorption lull width at half maximum (FWHM) of the photoelectric conversion layer is less than or equal to about 140 nm.

12. An image sensor comprising:
the organic photoelectric device of claim 1; and
a semiconductor substrate disposed under the organic photoelectric device, and
the semiconductor substrate includes
a first photo-sensing device configured to sense light in a red wavelength region, and
a second photo-sensing device configured to sense light in a blue wavelength region.

13. The image sensor of claim 12, wherein the organic photoelectric device is configured to sense light in a green wavelength region, the image sensor further comprising:
a second organic photoelectric device configured to sense light in a red wavelength region, and
third organic photoelectric device configured to sense light in a blue wavelength region.

14. An organic photoelectric device, comprising
a first electrode and a second electrode facing each other, and
a photoelectric conversion layer between the first electrode and the second electrode and selectively absorbing light in a green wavelength region,
wherein the photoelectric conversion layer includes at least one first photoelectric conversion material having a peak absorption wavelength (λmax1) of less than about 540 nm and at least one second photoelectric conversion material having a peak absorption wavelength (λmax2) of greater than or equal to about 540 nm,
the photoelectric conversion layer includes at least one p-type semiconductor and at least one n-type semiconductor to form a pn junction, and
each of the first photoelectric conversion material and the second photoelectric conversion material is the at least one p-type semiconductor.

15. The organic photoelectric device of claim 14, wherein the n-type semiconductor includes fullerene or a fullerene derivative.

16. An organic photoelectric device, comprising
a first electrode and a second electrode facing each other, and
a photoelectric conversion layer between the first electrode and the second electrode and selectively absorbing light in a green wavelength region,
wherein the photoelectric conversion layer includes at least one first photoelectric conversion material having a peak absorption wavelength (λmax1) of less than about 540 nm and at least one second photoelectric conversion material having a peak absorption wavelength (λmax2) of greater than or equal to about 540 nm, and the first photoelectric conversion material and the second photoelectric conversion material independently include a light absorption material represented by Chemical Formula 1:

EDG—HA—EAG     [Chemical Formula 1]

wherein, in Chemical Formula 1,
HA is a C2 to C30 heterocyclic group having at least one of Se, Te, S, and Si,
EDG is an electron donating group, and
EAG is an electron accepting group.

\* \* \* \* \*